United States Patent [19]

Ellis

[11] 4,298,903
[45] Nov. 3, 1981

[54] ELECTRONIC COMPONENT COOLING ARRANGEMENTS

[75] Inventor: Stafford M. Ellis, East Preston, England

[73] Assignee: The General Electric Company Limited, London, England

[21] Appl. No.: 50,972

[22] Filed: Jun. 22, 1979

[30] Foreign Application Priority Data

Jun. 29, 1978 [GB] United Kingdom ............... 28252/78

[51] Int. Cl.³ .............................................. H05K 7/20
[52] U.S. Cl. ................................. 361/386; 361/415; 361/399
[58] Field of Search ................... 174/16 HS; 361/381, 361/386–389, 390, 391, 395, 399, 415, 429; 357/81, 82

[56] References Cited

U.S. PATENT DOCUMENTS

| | | | |
|---|---|---|---|
| 3,364,395 | 1/1968 | Donofris | 361/386 |
| 3,631,325 | 12/1971 | Wenz | 361/386 |
| 3,662,224 | 5/1972 | Rauch | 361/415 |
| 3,678,342 | 7/1972 | Shaw | 361/386 |
| 3,760,233 | 9/1973 | Warwick | 361/415 |
| 4,193,444 | 3/1980 | Boyd | 174/16 HS |

OTHER PUBLICATIONS

"Heat Transfer Structure...," Jackson and Stout, IBM Tech. Discl. Bull., vol. 13, No. 12, May 1971, pp. 3644, 3645.

Adjustible Cold Plate Chip Cooling, Gupta, IBM Tech. Discl. Bull., vol. 20, No. 3, Aug. 1977, p. 1120.

*Primary Examiner*—Gerald P. Tolin
*Attorney, Agent, or Firm*—Kirschstein, Kirschstein, Ottinger & Corbrin

[57] ABSTRACT

An arrangement for cooling electronic components mounted on a card (41) wherein the card is carried in a heat conductive frame (17) which is urged by spring bias means (25) along a guide arrangement (21) provided in an open ended structure (13) so that the frame is in good thermal contact with a cold wall (11) to which the open end of the structure is held in releasable contact to form a housing for the frame.

9 Claims, 5 Drawing Figures

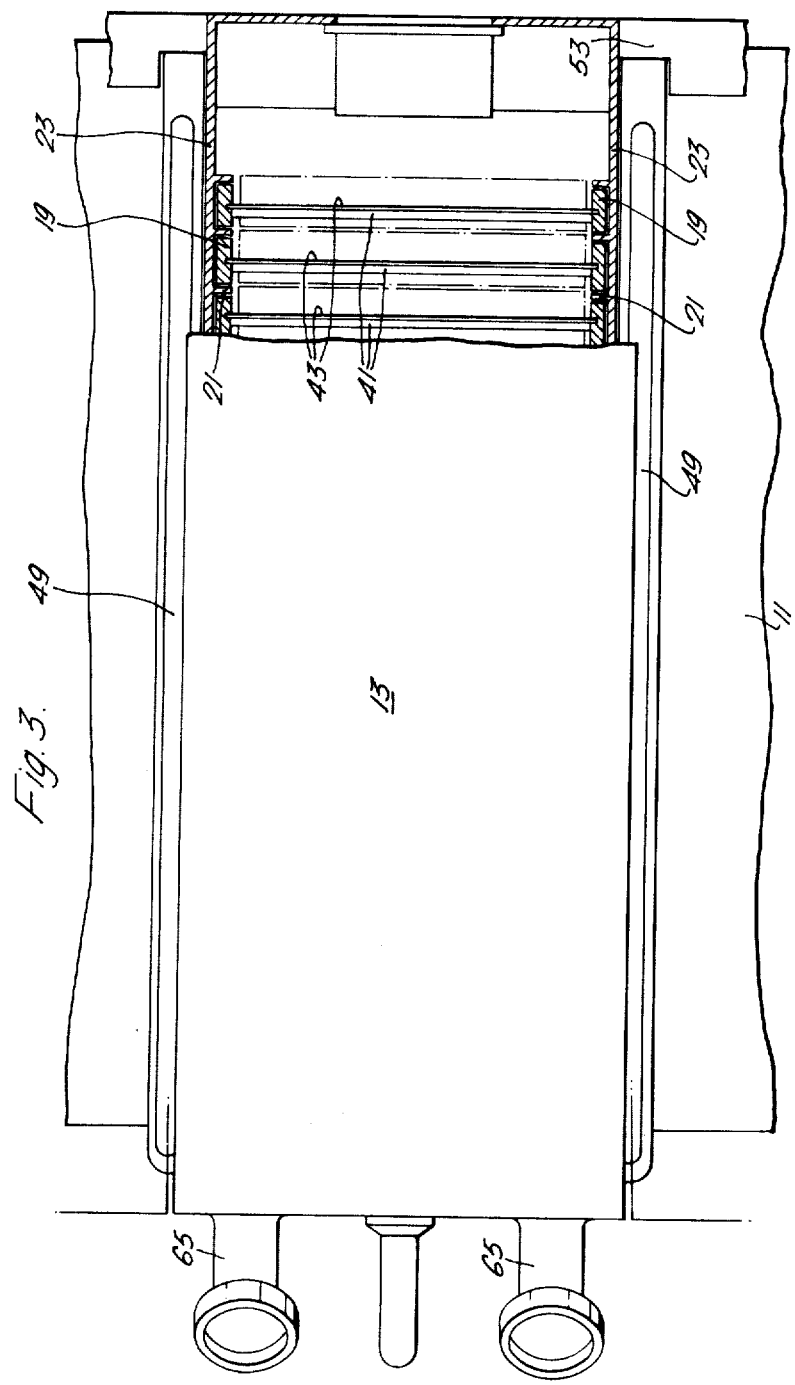

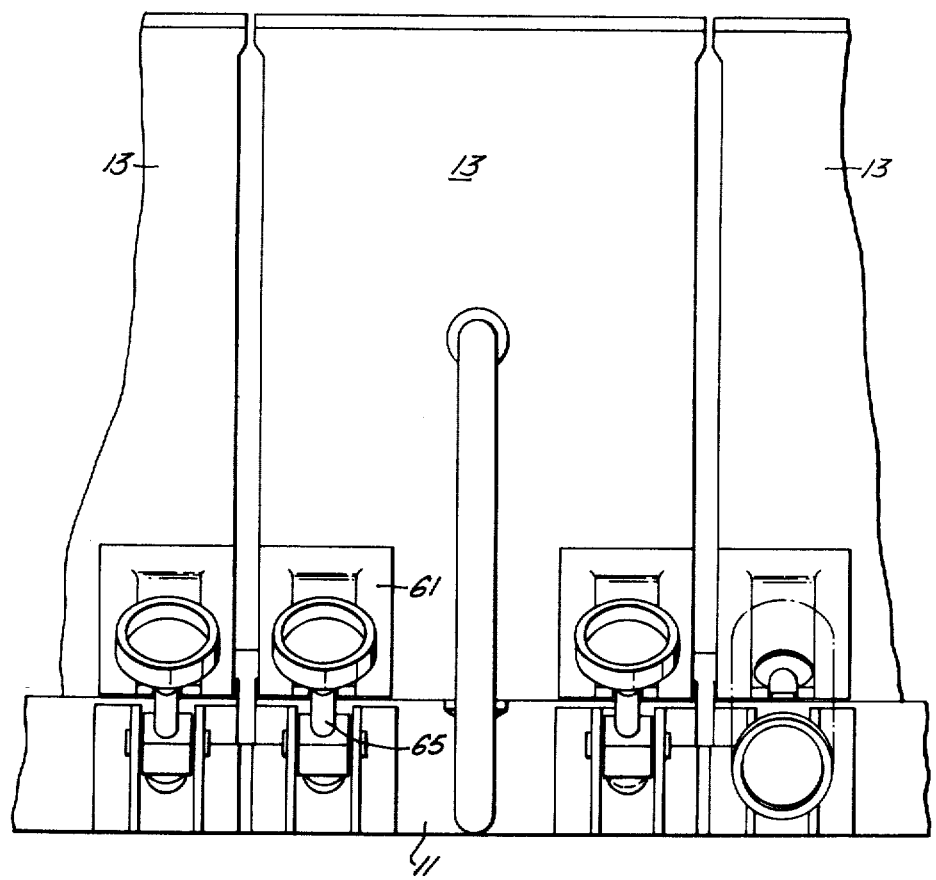

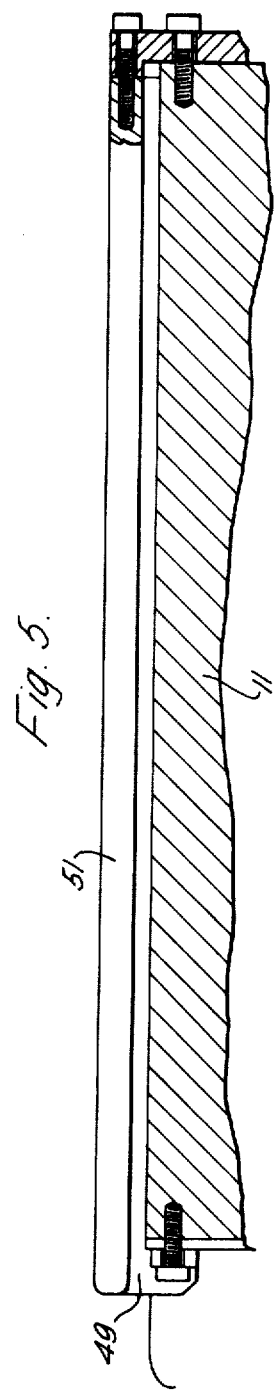

ELECTRONIC COMPONENT COOLING ARRANGEMENTS

This invention relates to electronic component cooling arrangements. More particularly the invention relates to arrangements for cooling electronic components mounted on cards such as printed circuit boards.

Commonly such cards have a conductive ladder or analogous conductive pattern for the purpose of conveying heat from the components mounted on the card to heat sinks disposed at the side edges of the card. The heat sinks are in good thermal contact with the sidewalls of a box housing the card. Sometimes the box sidewalls are essentially finned, and an electric blower arrangement drives heated air from the finned walls. In other arrangements heat is conveyed from the box by cooling air entering and leaving the box via ducts.

In some environments e.g. the cockpit of an aircraft, the performance of such arrangements is not satisfactory and it is an object of the present invention to provide a cooling arrangement capable of improved performance.

According to the present invention there is provided an arrangement for cooling electronic components mounted on a card comprising: a cold wall; an open ended wall structure in releasable contact at its open end with the cold wall to form a housing for the card; a guide arrangement within said housing adapted to receive the side members of a heat conductive support frame for the card; and preloaded spring bias means which urges the support frame along its guide arrangement into good thermal contact with the cold wall.

The support frame is suitable or rectangular U-shape form with its base in thermal contact with the cold wall.

The guide arrangement suitably comprises guides on opposed walls of the wall structure.

The spring bias means suitably comprises pockets in opposed walls of the wall structure each housing a spring; a plate fixed with respect to the wall structure serving to compress the springs; and parts located between the springs and the side members of the support frame whereby the compressive stress in the springs is transmitted to the support frame.

The plate suitably comprises a further card carrying electronic components and/or conductors with which the first mentioned card is electrically connected.

The cold wall is suitably provided with parallel guide rails having side flanges which co-operate with elongate guide ways on the external surface of the wall structure whereby the wall structure is located with respect to the cold wall with the side flanges of the guide rails projecting into the guide ways.

In one such an arrangement the cold wall is provided along one edge with an elongate member which extends at right angles to the direction of the parallel guide rails and has a surface opposing the surface of the cold wall thermally contacted by the wall structure so as to define a slot, said surface of the elongate member opposing the said surface of the cold wall being inclined thereto in the direction parallel to the rails and the corresponding end of the wall structure having a complementary inclined surface, the inclined surfaces of the wall structure and the cold wall on being brought into engagement producing a force acting on the wall structure in the direction towards the cold wall.

The opposite end of the wall structure is suitably provided with a further inclined surface which cooperates with a surface of a fastening member, pivotally connected to the cold wall, which upon rotation of the fastening member engages the further inclined surface of the wall structure urging that surface and, hence said opposite end of the wall structure, towards the cold wall.

It will be appreciated that in practical embodiments of the invention a plurality of guide arrangements is normally provided in the housing formed by the wall structure and cold wall, each adapted to receive the side members of a respective support frame and each provided with a respective individual spring bias means.

Similarly a plurality of wall structures may be provided to form a plurality of said housings sharing a common cold wall.

One arrangement in accordance with the invention will now be described by way of example with reference to the accompanying drawings in which:

FIG. 3 shows a part sectional plan view of the arrangement of FIG. 1;

FIG. 4 shows a front end elevation of the arrangement of FIG. 1; and

FIG. 5 is a scrap view of part of the arrangement.

Figure 1:
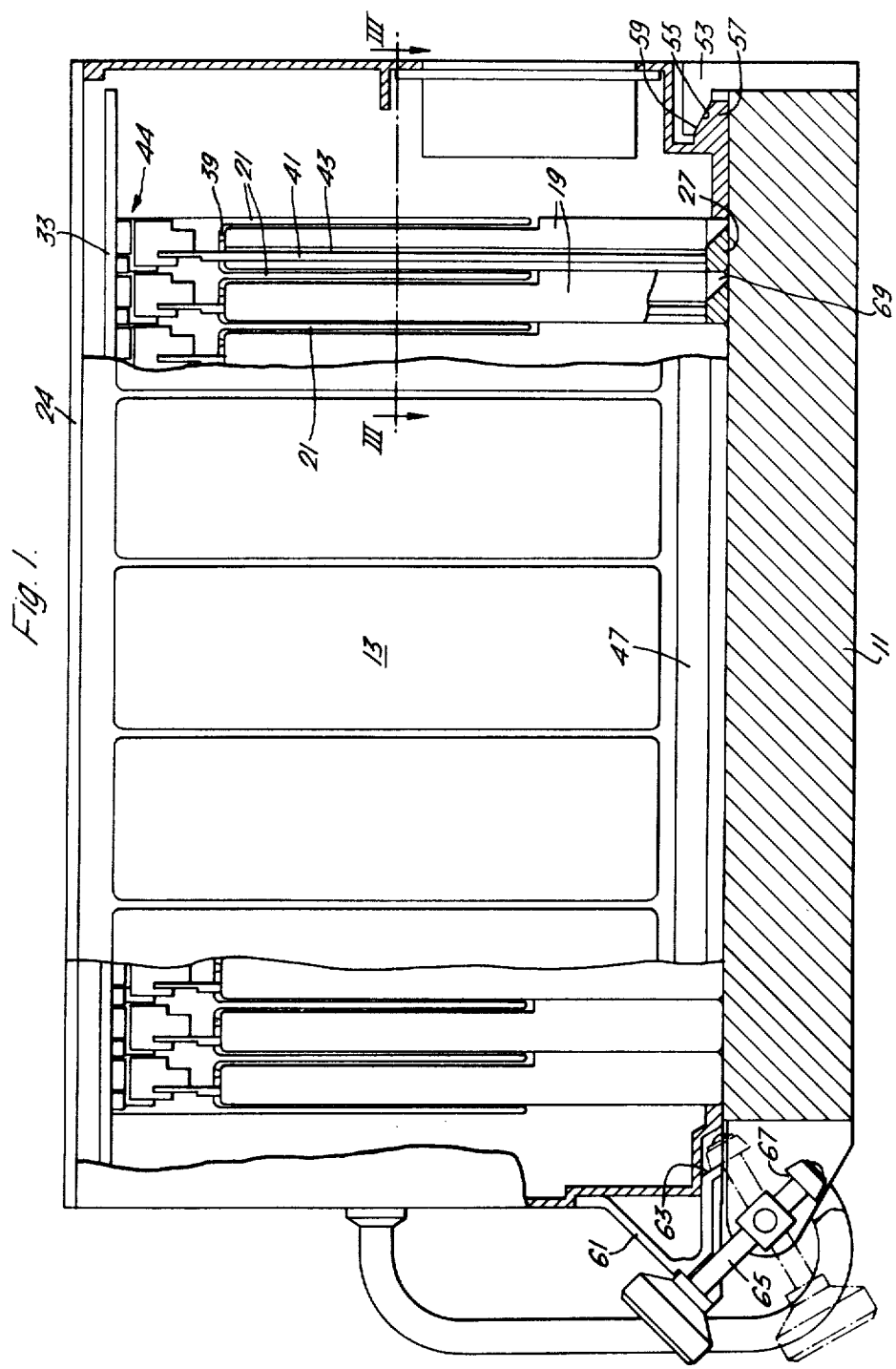
FIG. 1 shows a part sectional elevation of the arrangement.

Referring to the drawings, the arrangement includes a cold wall 11 and a wall structure 13 of opened-ended box form whose open end 15 is held in releasable contact with the cold wall 11 by means described below.

In the housing thus formed there are disposed in parallel relationship a plurality of U-shaped rectangular heat conductive circuit card support frames 17 whose side members 19 fit slidingly in parallel relationship in guide arrangements constituted by grooves defined by parallel ridges 21 on opposed side walls 23 of the structure 13, the ridges 21 extending perpendicular to the face of the cold wall 11 contacted by the structure 13. The structure 13 has a top closure-member 24. There is sufficient space between the side members 19 of the frames 17 and the bottom surfaces of the guide grooves defined by ridges 21 to accommodate small tilts of the frames 17 due to manufacturing tolerances.

Each frame 17 is associated with two preloaded spring bias means 25, one at each side of the frame 17. The spring bias means 25 urge the support frames 17 along their respective guide arrangements so that the bottom members 27 of the frames make good thermal contact with the cold wall 11.

The spring bias means 25 comprise springs 29 housed in individual pockets 31 in the side walls 23 of the wall structure 13, the side walls 23 being formed as a casting with integral spring pockets 31 and ridges 21.

The springs 29 are preloaded by contact with a circuit board 33 secured to the wall structure 13 by screw fastenings 35. The springs 29 bear on piston members 37 each of which has a central spigot portion 39 which extends through a passage in the bottom of its spring pocket 31 and bears on the upper surface of the side member 19 of the associated frame 17. The frames 17 are therefore pressed downwardly so that there is a good thermal contact between the bottoms 27 of the frames 17 and the cold wall 11.

Each support frame 17 carries a circuit card 41 having a heat conductive ladder pattern 43, the side members 19 of each support frame 17 making good thermal contact with the side members of the ladder pattern 35 of the associated card 33, so that the ladder pattern on a card is in good thermal contact with the cold wall 11 via the frame 17.

It will be appreciated that heat generated in components carried by the cards (contained in the space indicated by chain dotted lines in FIG. 3) will thus be rapidly conducted to the cold wall 11.

The circuit board 33 constitutes a 'mother' board for the circuit cards 41, the space between the mother board 33 and the cards 17 housing standard two-part electrical connector arrangements 44 for the required electrical interconnections.

To locate the wall structure 13 on the cold wall 11, the lower marginal portions 45 of the side walls 23 of the wall structure have guide ways 47 which cooperate with parallel guide rails 49 bolted to the cold wall 11, the rails 49 having flanges 51 which project into the guide ways 47.

To secure the wall structure 13 to the cold wall 11 an L-shaped channel member 53 is bolted to the cold wall 11, the member 53 providing a surface 55 inclined to the surface of the wall 11 contacted by the structure 13 to define a slot. The bottom of the structure 13 has a transverse portion 57 formed with a complementary inclined surface 59. When, guided by the rails 49, the wall structure 13 is slid into position the portion 57 enters the slot so that the two complementary surfaces 55 and 59 contact and the rear of the wall structure 13 is pressed firmly into contact with the cold wall 11.

At the front of the structure 13 there is a bracket 61 also with an inclined surface 63 and a fastening member 65 pivoted on the cold wall 11. When the member 65 is rocked from the position shown in full lines to the position shown in chain dotted lines (FIG. 1) a surface 67 of the member 65 engages the surface 63 of the bracket 61 and the front of the structure 13 is thereby firmly held to the cold wall 11.

For ease of removal of the cards 41 the bottom members 27 of the frames 17 have milled grooves 69. An elongate extraction tool (not shown) can be introduced between adjacent cards and, by virtue of the grooves 69, accces can be had to the bottom edge of a card when it is desired to extract it from its support frame 17.

The cold wall 11 may be a structural member of the environment of the arrangement, and it may have channels through which cooling fluid circulates. When used in an aircraft the cooling fluid could possibly be aviation spirit.

Figure 2:
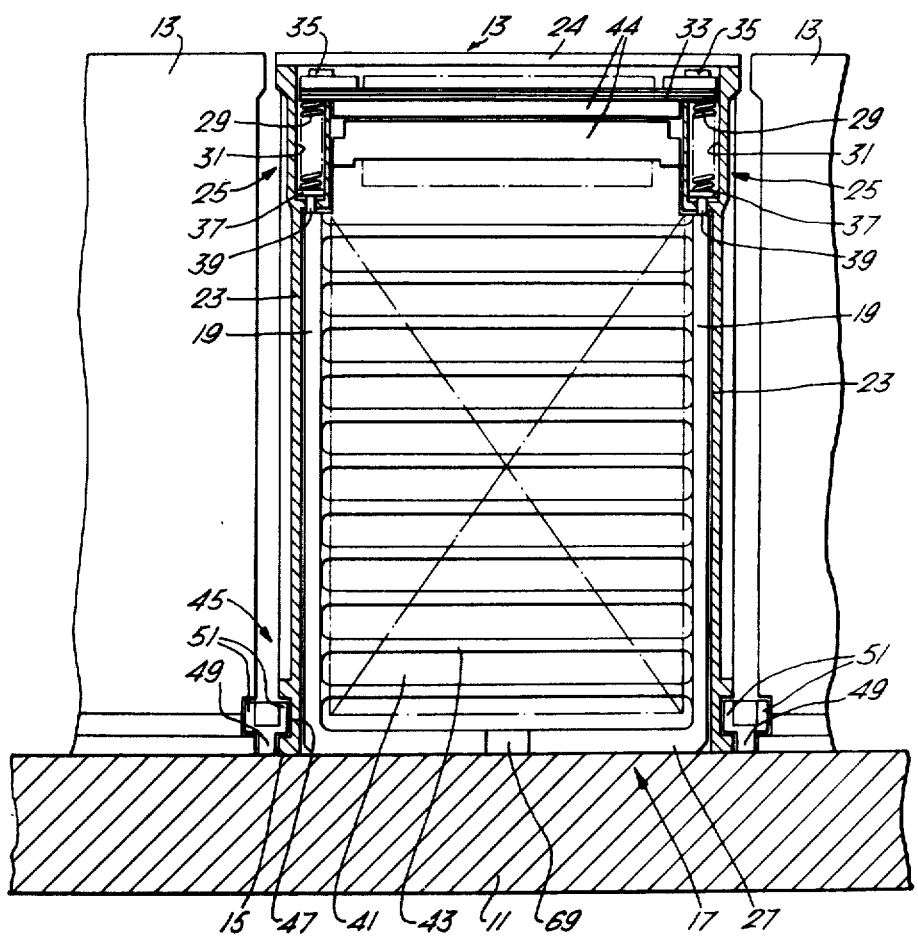
FIG. 2 shows a transverse section through the arrangement of FIG. 1.

It will be appreciated that a single cold wall may carry a number of wall structures 13, side by side, as indicated in FIGS. 2, 3 and 4.

I claim:

1. An electronic component cooling arrangement comprising:
(a) a cold wall;
(b) a wall structure in the form of a box open at one end in releasable contact at its open end with the cold wall to form a housing;
(c) a card within the housing;
(d) a plurality of electronic components mounted on the card;
(e) a heat conductive support frame within said housing having transverse side and end members and which supports said card with the components mounted on the card in good thermal contact with the frame;
(f) a guide arrangement within the housing receiving said side members of the frame; and
(g) preloaded spring bias means which is mounted on the wall structure and urges the support frame along said guide arrangement so that a said end member of the frame is in good thermal contact with the cold wall.

2. An arrangement according to claim 1 wherein the support frame is of U-shaped rectangular form with its base in thermal contact with the cold wall.

3. An arrangement according to claim 1 wherein the guide arrangement comprises guides on opposed walls of the wall structure.

4. An arrangement according to claim 3 wherein the guides comprise grooves defined by ridges on the wall structure walls.

5. An arrangement according to claim 1 wherein the spring bias means comprises pockets in opposed walls of the wall structure each housing a spring; a plate fixed with respect to the wall structure serving to compress the springs; and parts located between the springs and the side members of the support frame whereby the compressive stress in the springs is transmitted to the support frame.

6. An arrangement according to claim 5 wherein said plate comprises a further card carrying electronic components and/or conductors with which the components carried by the first mentioned card are electrically connected.

7. An arrangement according to claim 1 wherein the cold wall is provided with parallel guide rails having side flanges which co-operate with elongate guide ways on the external surface of the wall structure whereby the wall structure is located with respect to the cold wall with the side flanges of the guide rails projecting into the guide ways.

8. An arrangement according to claim 7 wherein the cold wall is provided along one edge with an elongate member which extends at right angles to the direction of the parallel guide rails and has a surface opposing the surface of the cold wall thermally contacted by the wall structure so as to define a slot, said surface of the elongate member opposing the said surface of the cold wall being inclined thereto in the direction parallel to the rails and the corresponding end of the wall structure having a complementary inclined surface, the inclined surfaces of the wall structure and the cold wall on being brought into engagement producing a force acting on the wall structure in the direction towards the cold wall.

9. An arrangement according to claim 8 wherein at its end opposite said corresponding end the wall structure is provided with a further inclined surface which co-operates with a surface of a fastening member, pivotally connected to the cold wall, which upon rotation of the fastening member engages the further inclined surface of the wall structure urging that surface, and hence said opposite end of the wall structure, towards the cold wall.

* * * * *